United States Patent [19]
Hasegawa et al.

[11] Patent Number: 5,298,111
[45] Date of Patent: Mar. 29, 1994

[54] AUTOMATIC WAFER TRANSFER APPARATUS AND A METHOD FOR TRANSFERRING WAFERS AND AN ETCHING DRUM

[75] Inventors: Fumihiko Hasegawa, Saitama; Tatsuya Yamamoto; Shinji Sato, both of Fukushima, all of Japan

[73] Assignee: Shin-Etsu Handotai Co., Ltd., Tokyo, Japan

[21] Appl. No.: 890,192

[22] Filed: May 29, 1992

[30] Foreign Application Priority Data

May 31, 1991 [JP] Japan .................................. 3-156089
May 31, 1991 [JP] Japan .................................. 3-156092

[51] Int. Cl.⁵ ...................... H01L 21/306; B44C 1/22
[52] U.S. Cl. .................................. 156/639; 156/645; 156/651; 156/662; 156/345
[58] Field of Search .............. 156/637, 639, 645, 651, 156/654, 662, 345; 414/471, 497, 525.1, 564, 592, 661, 785

[56] References Cited

U.S. PATENT DOCUMENTS 3,964,957 6/1976 Walsh .......................... 156/637 X
4,388,140 6/1983 Nakazato et al. ................... 156/345

Primary Examiner—William A. Powell
Attorney, Agent, or Firm—Lowe, Price, LeBlanc & Becker

[57] ABSTRACT

An automatic wafer transfer apparatus for transferring at once a plurality of wafers from a wafer basket to an etching drum which can be opened and closed by means of a movable housing and a horizontal set bar, to contain wafers therein; the wafer transfer apparatus comprising an elevator for elevating and lowering wafers, adapted to reciprocate vertically such that its top surface can pass through the etching drum to carry in the wafers, and the movable housing and the set bar of the etching drum for opening and closing the etching drum.

9 Claims, 8 Drawing Sheets

AUTOMATIC WAFER TRANSFER APPARATUS AND A METHOD FOR TRANSFERRING WAFERS AND AN ETCHING DRUM

BACKGROUND OF THE INVENTION

The present invention relates to an automatic etching unit for etching semiconductor wafers, and in particular it relates to such an etching unit having (i) an automatic wafer transfer apparatus (mechanism) capable of automatically transferring all of the wafers contained in a basket to an etching drum at a time, and (ii) an etching drum capable of allowing all the wafers contained in the drum to be etched without being removed from the drum. Furthermore, the invention relates to a method for automatically transferring all of the wafers contained in a basket to the etching drum at a time.

DESCRIPTION OF THE PIROR ART

A semiconductor wafer to be made into substrates for semiconductor electronic devices is produced in the following manner: a single crystal ingot of a semiconductor material such as silicon is sliced into thin plates by cutting it in a direction substantially normal to the axis of the ingot; then, the faces of the plates are lapped, etched, annealed and polished and eventually the plates are rendered thin round disks having a mirror face on one side of them.

After the lapping, the wafers are contained in a wafer basket which carries them to a location where etching is conducted, and there the wafers are transferred from the basket to an etching drum, and the etching drum together with the wafers is submerged into an etchant so that the surfaces of the wafers are wetted and etched by the etchant, whereby the surface irregularities and the lapping abrasive powder rubbed into the surfaces of the wafers, which is caused during the surface lapping, are removed.

Although the etching operation itself is conducted automatically by means of a known etching unit, the transfer operation of the wafers from the lapping location to the etching location and that from the etching location to the polishing location were not automatic, nor were they conducted in an in-line manner.

PROBLEMS THE INVENTION SEEKS TO SOLVE

Since the transportation of wafers from one location to another was not automatic, the overall etching operation required much time and a constant attention of a human operator.

Thus, it has been desired that the series of operations in the etching unit are all conducted automatically on end. To realize this it was necessary to automatize the wafer transportation operations, and the wafers ought to be inserted by a means more sophisticatedly designed than the conventional transfer means is. For example, when a basketful of wafers already lapped and housed in the wafer basket are to be automatically etched at the etching location, the wafers in the basket must be automatically transported into the etching drum of the etching unit.

The present invention was made in view of these problems, and it is, therefore, an object of the invention to provide an automatic wafer transfer apparatus capable of automatically transferring all of the wafers contained in a basket to an etching drum at a time, and also to provide such an etching drum capable of allowing all the wafers contained in the drum to be etched without being removed from the drum. Furthermore, the invention proposes a method for automatically transferring all of the wafers contained in a basket to the etching drum at a time.

SUMMARY OF THE INVENTION

Means to solve the Problems

In order to attain the object of the invention, there is provided an etching drum having
- a main housing (frame body 11) consisting of a pair of vertical side plates (11a, 11b), which face parallel to each other and supported by the etching machine (10) in a manner such that the main housing is capable of freely turning around about a central horizontal axis,
- at least two rollers (12, 13) supported, freely rotatory, by and between the side plates of the main housing in a manner such that the rollers' horizontal center lines define a hypothetical circular cylinder whose diameter is slightly greater than that of the wafers so that the peripheral edges of the wafers rest on the rollers, and whose center line is identical with the said central horizontal axis, the surface of these rollers being formed with numerous annularly cut grooves (20b) suitable to receive the edges of the wafers and support the wafers vertically at suitable intervals in a horizontal row, and
- a drive mechanism for driving the rollers to rotate;

said etching drum being characterized by that there are further provided
- a movable housing (17) consisting of a pair of side plates (17a, 17b) which face parallel to each other and are freely rotatory about said central horizontal axis independently from said main housing,
- a horizontal set bar (20) supported between the side plates of the movable housing, the surface of the set bar being formed with numerous annularly cut grooves similar to those of said rollers, and the position of the set bar being such that its center line is a generating line of said hypothetical circular cylinder defined by the center lines of said rollers, and
- a drive mechanism for driving the movable housing to rotate about the central axis.

In a preferred mode of the invention, the set bar is supported by the movable housing in a manner such that the set bar is freely rotatory about its center line, and the set bar is adapted to rotate about its center line driven by means of said drive mechanism for the rollers.

Preferably, said drive mechanism for the rollers comprises: small-diameter gears locked at those ends of said rollers which extend beyond one of the main housing's side plates; a small-diameter gear locked about that end of said set bar which is on the same side as the gear-bearing ends of the rollers; and a large-diameter gear which is rotary about said central axis and meshes with all of the small-diameter gears.

Furthermore, according to the invention, there is also provided an automatic wafer transfer apparatus for automatically transferring a plurality of wafers housed in a wafer basket to an etching drum which is constructed as described above and thus can assume an open posture whereby it can receive wafers, and a closed posture whereby wafers cannot escape from the etching drum, said wafer transfer apparatus comprising:

a transport means for transporting a basket containing the wafers to a location below said etching drum, an elevator means (8, 28) for elevating and lowering wafers, adapted to reciprocate vertically such that its top surface can pass through said etching drum, and a means (movable housing and set bar) for opening and closing said etching drum.

In another preferred embodiment, the elevator means includes a wafer fork (8) which is vertically shiftable by means of an air cylinder (6), and a wafer pusher (28) provided on top of the wafer fork and having a top surface whose profile of a vertical cross-section is caved in in a suitable manner to receive wafers vertically thereon. The the cross-section of the concavity of the pusher top surface may be of V-letter shape or circular having the same curvature as the wafers.

In a further embodiment, the wafer pusher has a vertical guide groove (30) no each side and the inner wall of each side plate of the housing is formed with a vertical guide protrusion, said guide groove and said guide protrusion being slidably engageable so that the vertical movement of the wafer pusher is properly guided.

There is also provided a method for automatically transferring a plurality of wafers at a time, from a wafer basket to an etching drum which can assume an open posture whereby it can receive wafers and a closed posture whereby wafers cannot escape from the etching drum, comprising the steps of:

transporting the wafer basket containing the wafers to a location below said etching drum, causing the etching drum to open downwardly, elevating the wafers from the wafer basket into the etching drum by means of an elevator means, causing the etching drum to close sufficiently to prevent the wafers from dropping, while supporing the wafers by the elevator means, and removing the elevator means from the etching drum, and completely closing the etching drum.

Effects

According to the invention, it is possible to automatically transfer a plurality of wafers all at once, from the wafer basket to the etching drum, by observing the following steps: transporting the wafer basket containing the wafers to a location below said etching drum; causing the etching drum to open downwardly; elevating the wafers from the wafer basket into the etching drum by means of an elevator means; causing the etching drum to close sufficiently to prevent the wafers from dropping, while supporing the wafers, and removing the elevator means from the etching drum, and completely closing the etching drum. Thus, transferring of the wafers from the wafer basket to the etching drum is automatically conducted and the automatization of the wafer manufacture process is furthered.

Furthermore, according to the invention, the movable housing and the set bar supported by the movable housing constitute the means for opening and closing the etching drum, and this opening and closing means is automatically driven by means of the drive mechanism, so that the plurality of wafers housed in the basket are simultaneously and automatically transferred to the etching drum and vice versa, whereby it is possible to conduct the wafer manufacture process in an in-line manner.

These and other objects and many of the attendant advantages of this invention will be readily appreciated as the same becomes better understood by reference to the following detailed description when considered in connection with the accompanying drawing.

EMBODIMENT

Next, an embodiment of the invention will be described with reference to the attached drawings.

Figure 1:
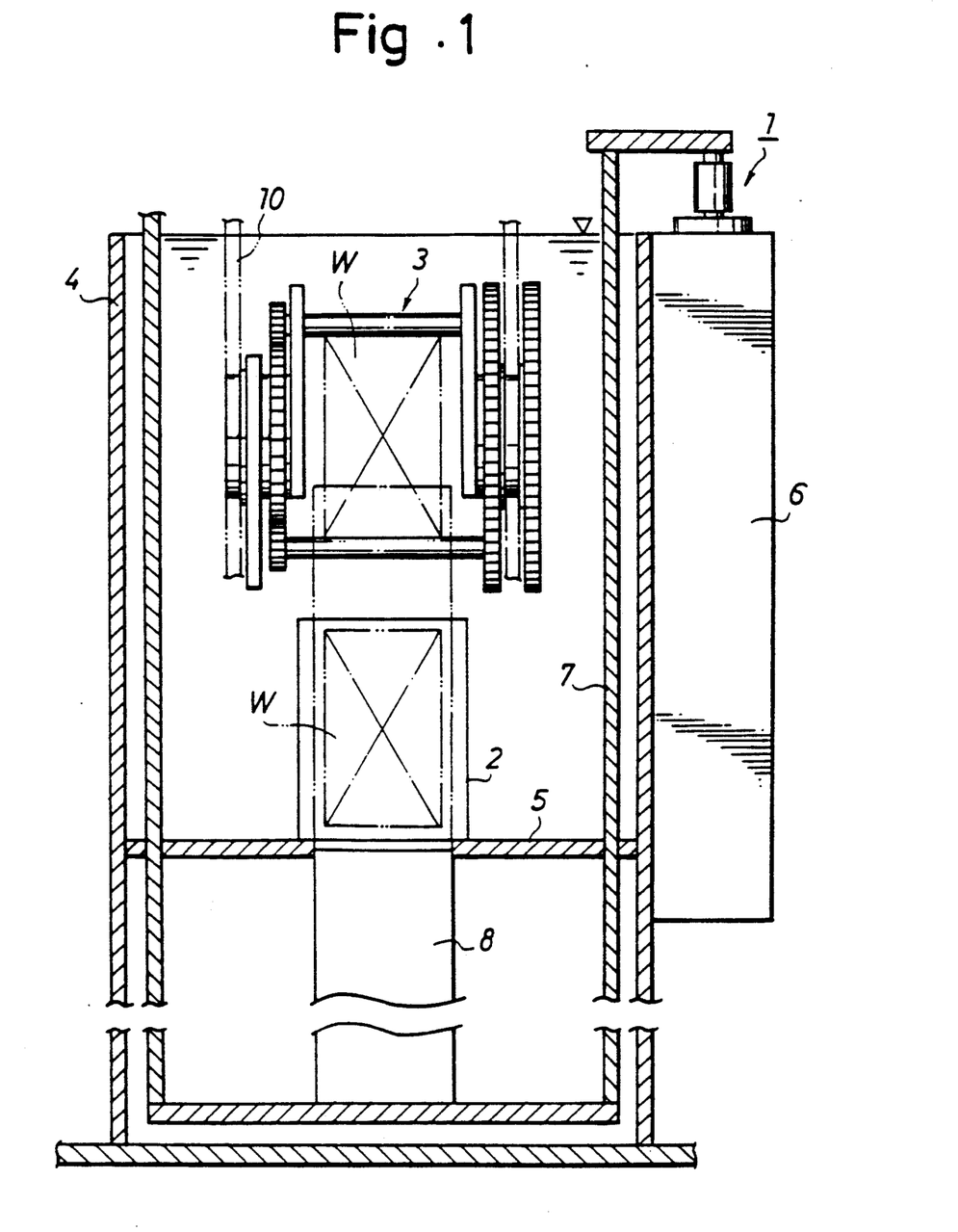
FIG. 1 is a front view of a wafer transfer apparatus of the invention.
Figure 2:
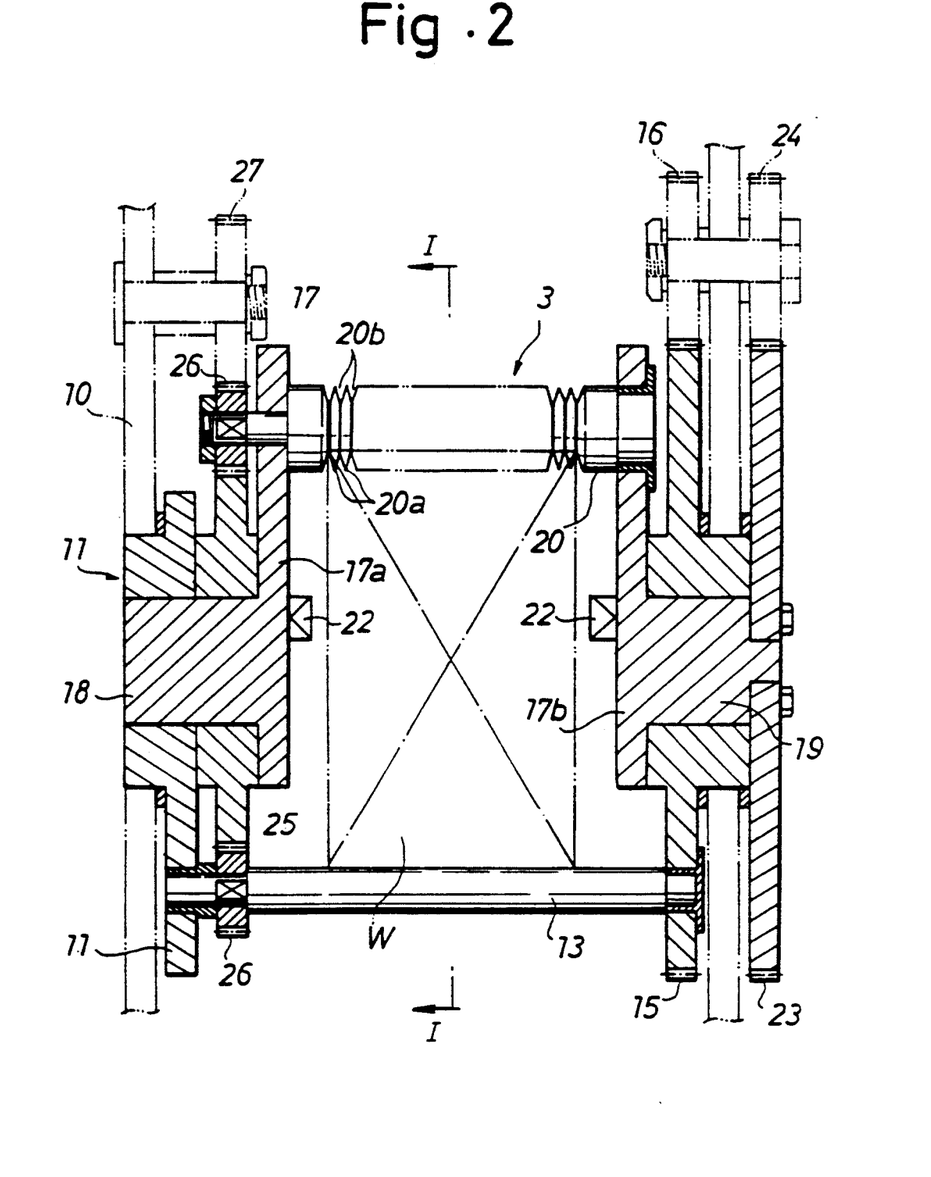
FIG. 2 is a cross-sectional view of an etching drum of the invention.
Figure 3:
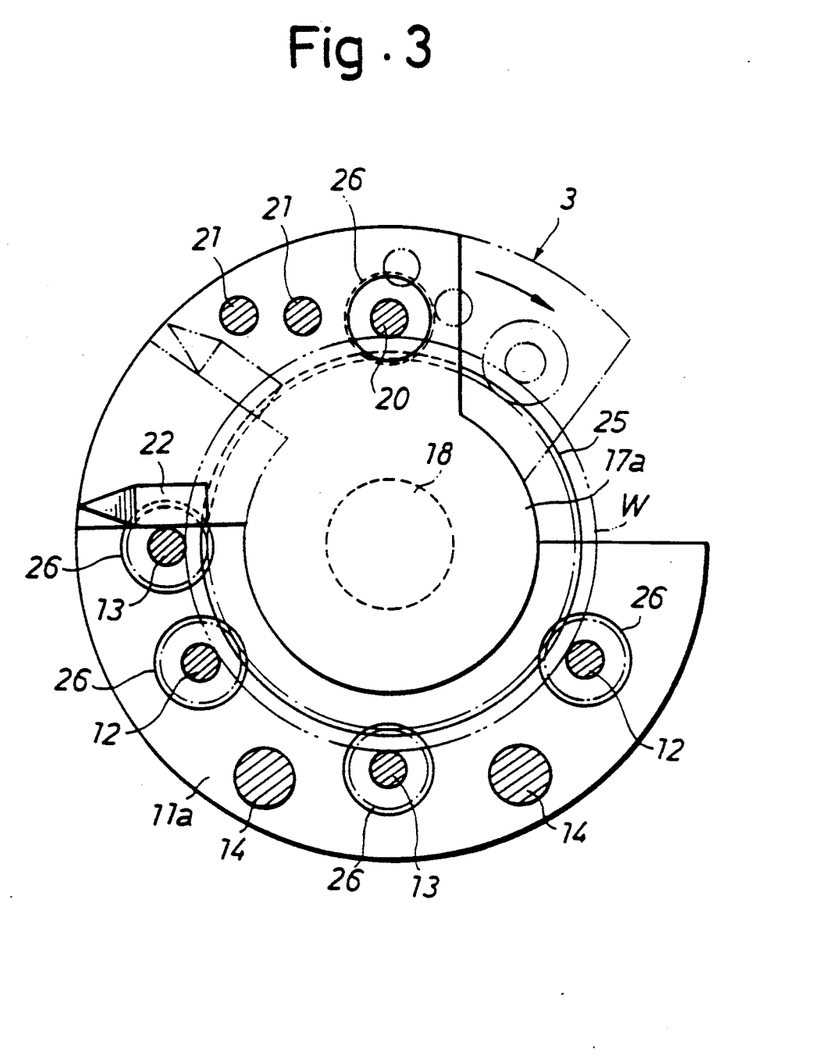
FIG. 3 is another cross-sectional view of the etching drum taken on and viewed in the direction of arrows I—I of FIG. 2.
Figure 4:
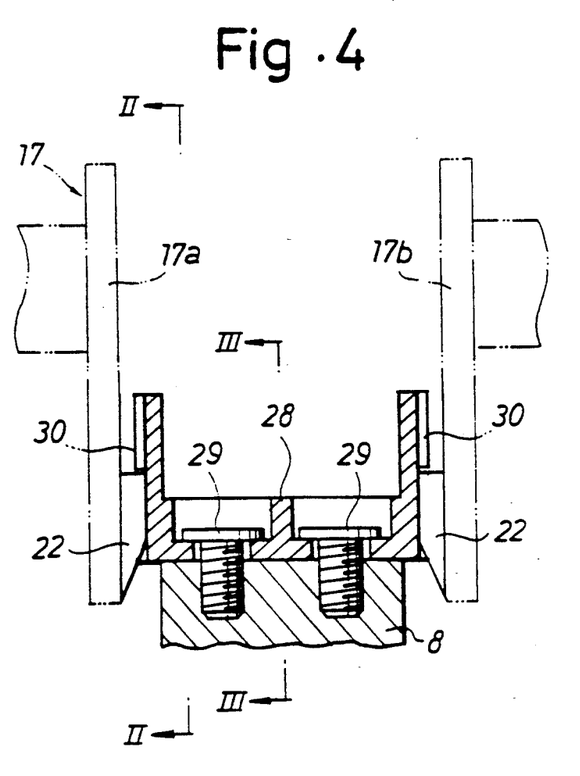
FIG. 4 is a cross-sectional view showing how a wafer fork engages with the etching drum when the latter is open.
Figure 5:
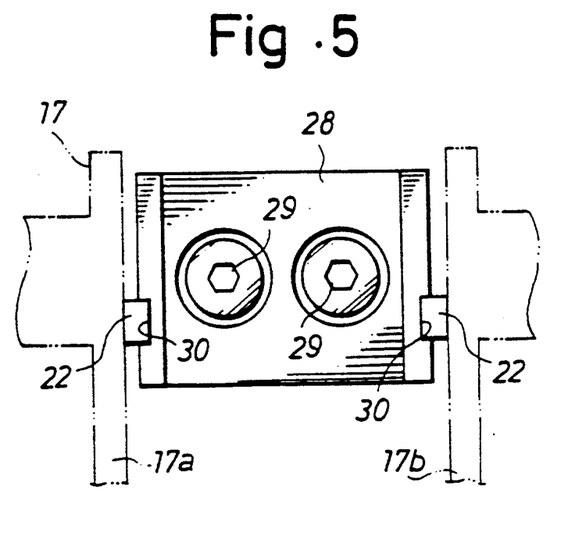
FIG. 5 is a top plan view of what is shown in FIG. 4.
Figure 6:
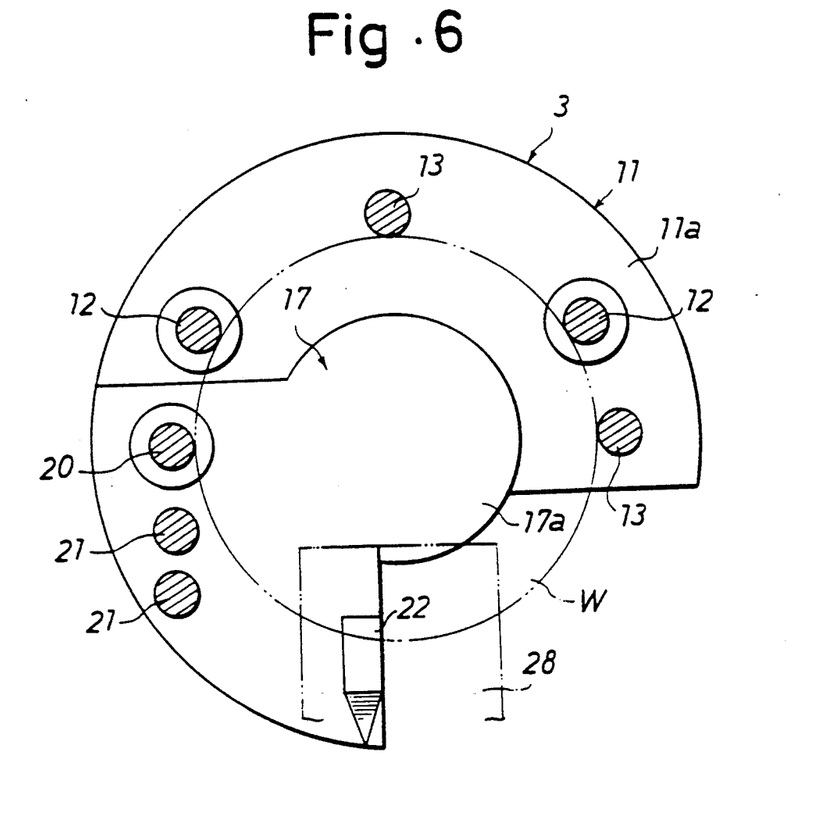
FIG. 6 is a cross-sectional view taken on and viewed in the direction of arrows II—II of FIG. 4.
Figure 7:
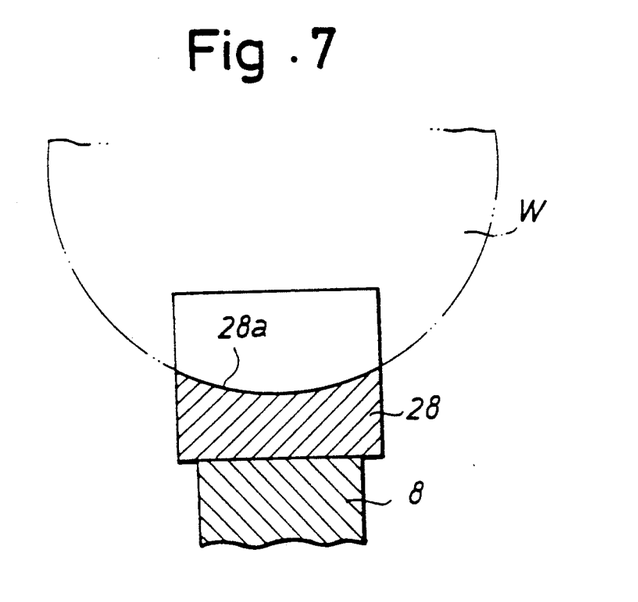
FIG. 7 is a cross-sectional view taken on and viewed in the direction of arrows III—III of FIG. 4.

FIG. 1 is a front view of a wafer transfer apparatus of the embodiment, FIG. 2 is a cross-sectional view of an etching drum of the embodiment; FIG. 3 is another cross-sectional view of the etching drum taken on and viewed in the direction of arrows I—I of FIG. 2, FIG. 4 is a cross-sectional view showing how a wafer fork engages with the etching drum when the latter is open, FIG. 5 is a top plan view of what is shown in FIG. 4, FIG. 6 is a cross-sectional view taken on and viewed in the direction of arrows II—II of FIG. 4, and FIG. 7 is a cross-sectional view taken on and viewed in the direction of arrows III—III of FIG. 4.

The wafer transfer apparatus 1 shown in FIG. 1 is adapted to simultaneously and automatically transfer a plurality of already lapped wafers W from a wafer basket 2 wherein they are housed, to an etching drum 3 of an etching machine 10, and is installed under the pure water held by a transfer tank 4.

A horizontal set floor 5 is formed in the transfer tank 4, and the basket 2 is set on the set floor 5. A support stay 7, which is capable of being vertically shifted by means of an air cylinder 6, is installed inside the transfer tank 4 in a manner such that the stay 7 penetrates the set floor 5, and a wafer fork 8 is mounted on the bottom floor of the stay 7 in a manner such that the fork 8 stands vertically and penetrates the set floor 5. The basket 2 is adapted to be transported by means of a basket carrier, not shown, and set into a position inside the transfer tank 4 which the basket 2 is assuming in FIG. 1.

Above the basket 2 in the transfer tank 4 is suspended the etching drum 3 supported by the etching machine 10.

Now, with reference to FIGS. 2 and 3, the construction of the etching drum 3 according to the embodiment of the invention will be explained.

In FIG. 2, the reference numeral 3 designates a wafer etching drum of the embodiment, and 11 designates a housing consisting of a pair of vertical side plates 11a and 11b, which face parallel to each other; and horizontal, collinear rotary shafts 18 and 19 are fitted in the respective side plates 11a, 11b. The housing 11 is supported by the etching machine 10 in a manner such that the housing 11 is capable of freely turning around.

Two main rollers 12, 12 and supplementary rollers 13, 13 are supported, freely rotatory, by and between the side plates 11a, 11b of the housing 11 in a manner such that the rollers' horizontal center lines define a hypothetical circular cylinder whose center line is identical with the center line of the shafts 18, 19. The side plates 11a, 11b are reinforced by means of two horizontal reinforce bars 14, 14, which connect and bind the plates together. Also, the side plate 11b is at the same time a large-diameter gear 15, which meshes with a small-diameter drive gear 16, an element of the etching machine 10.

A movable housing 17 is supported, freely rotatory, in the housing 11. That is, the rotary shafts 18 and 19, which extend externally from the side plates 17a, 17b of this movable housing 17, are received, freely rotatory, in the bore of the side plates 11a, 11b of the movable housing 11. A set bar 20, similar to the main rollers 12, is supported, freely rotatory, between the side plates 17a, 17b, and these side plates 17a, 17b are reinforced by means of two horizontal reinforce bars 21, 21, which connect and bind the plates together. Incidentally, the surface of the set bar 20 is formed with numerous annularly cut grooves 20b and thus made numerous annular teeth 20a, except at the end portions of the set bar 20, as shown in FIG. 2. The teeth 20a and the grooves 20b are of such dimension appropriate to receive the edges of the wafers W in the grooves 20b and support the wafers W vertically at suitable intervals in a horizontal row. Similarly, the surfaces of the main rollers 12, 12 are formed with such grooves as 20b.

On the inner surface of each side plate 17a, 17b of the housing 17 is formed a straight guide ridge 22 (ref. Fig. 2 and FIG. 3). A large-diameter gear 23 is locked about the end portion of the rotary shaft 19 of the side plate 17b, and meshes with a small-diameter drive gear 24, an element of the etching machine 10.

A large-diameter center gear 25 (idler gear) is supported, freely rotatory, round the rotary shaft 18 of the side plate 17a, and meshes with the small-diameter gears 26 locked about the left ends, as seen in FIG. 2, of the main rollers 12, 12, the set bar 20, and the supplementary rollers 13, 13. The gear 26 of the set bar 20 meshes with a drive gear 127, an element of the etching machine 10.

Next, the manner of transferring the wafers W from the basket 2 to the etching drum 3 by means of the wafer transfer apparatus 1 will be explained with reference to FIGS. 8 through 12. Incidentally, FIG. 8 through FIG. 12 are schematic drawings showing how the wafer transferring operation is conducted.

Figure 8:
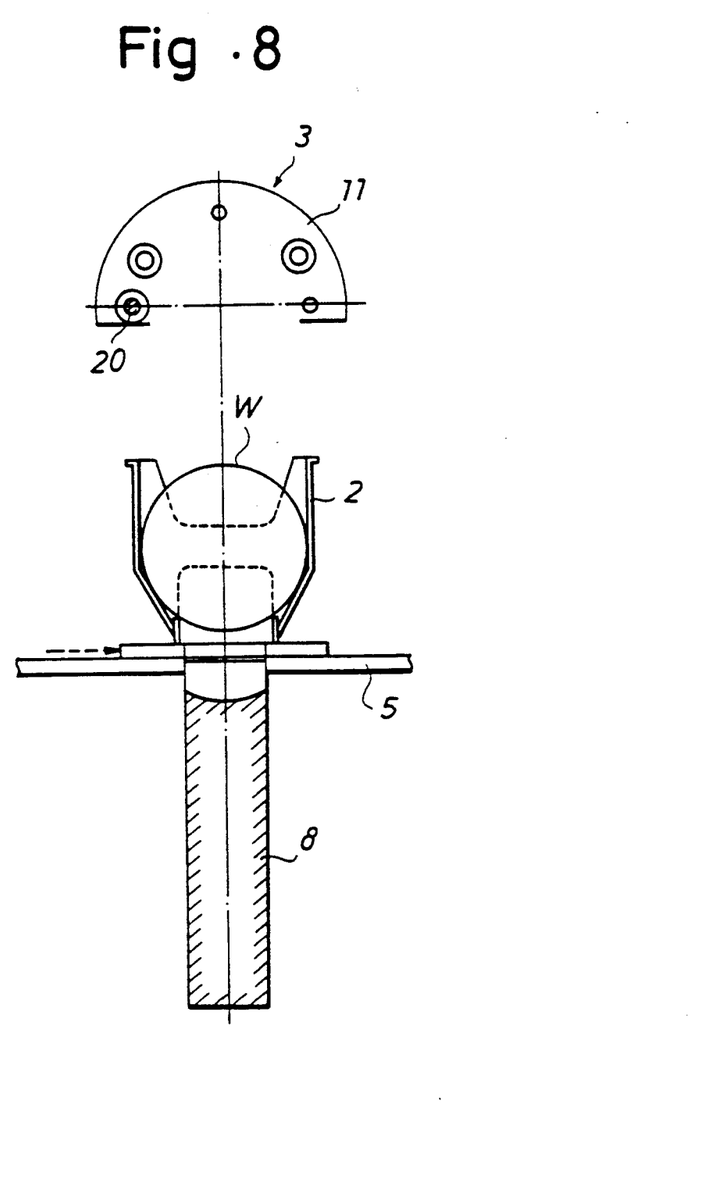
FIG. 8 is a schematic drawing showing one step of wafer trasfer operation.

Firstly, as shown in FIG. 8, the basket 2 is set on the floor 5 at a location which is below the wafer etching drum 3 and above the wafer fork 8, by means of a transfer means, not shown. Now, as shown in FIG. 6, the movable housing 17 of the etching drum 3 is turned to an extent such that the guide ridges 22, 22 formed on the inner walls of the side plates 17a, 17b come vertical, and in this posture the etching drum 3 opens downwardly, as shown in FIG. 8.

Figure 9:
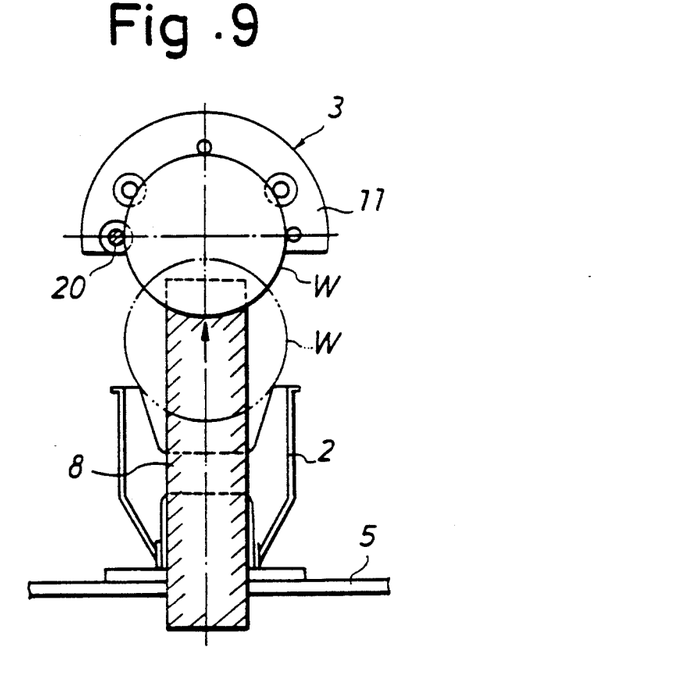
FIG. 9 is a schematic drawing showing one step of wafer trasfer operation.
Figure 10:
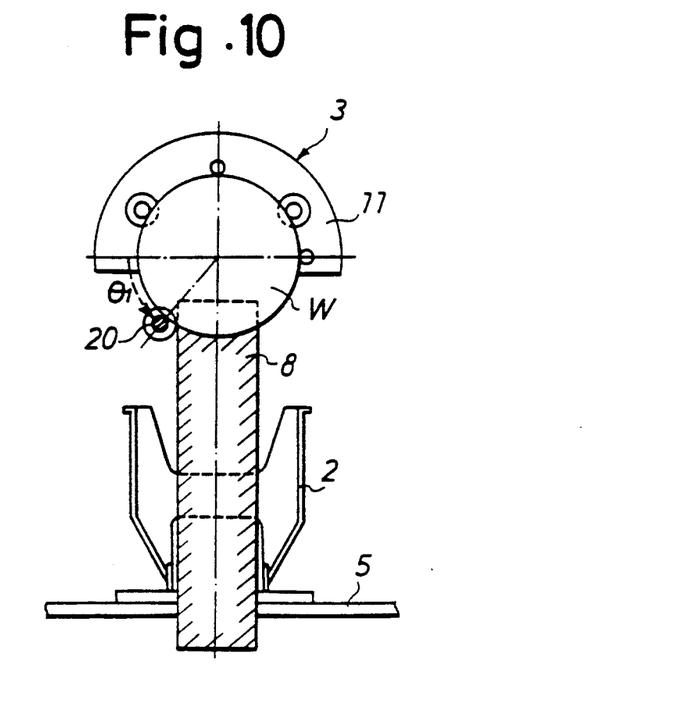
FIG. 10 is a schematic drawing showing one step of wafer trasfer operation.

Next, driven by the air cylinder 6, shown in FIG. 1, the wafer fork 8 is caused to rise up, and all of the wafers W in the basket 2 are supported and pushed up by the fork 8, as shown in FIG. 9, and eventually the wafers W are housed in the etching drum 3, as shown in FIG. 10.

As shown in FIG. 4 and FIG. 5, a wafer pusher 28 is fixed onto the top face of the wafer fork 8 by means of screws 29, 29, and outer faces of the side plates of the pusher 28 are formed with vertical guide grooves 30, 30, which engage slidably with the guide ridges 22, 22. As shown in FIG. 7, the pusher 28 is formed with a concave curved surface 28a, which has a curvature equal to that of the wafers W so that the edges of the wafers W fit on the surface 28a.

When the wafer fork 8 supports and pushes the wafers W up, the pusher 28 enters the etching drum 3, and the guide ridges 22, 22 engage with the guide grooves 30, 30, so that the ascending movement of the wafer fork 8 is properly guided; as the result, the wafers W softly alight and fit in the grooves formed in the surface of each roller 26 without a collision and the drum 3 entirely houses the wafers W. Incidentally, the lengths and the positions of the guide ridges 22, 22 and the guide grooves 30, 30 are such that, by the time the wafer fork 8 completes its ascent, the guide grooves 30, 30 and the guide ridges 22, 22 will have passed each other, so that the subsequent turning movement of the movable housing 17 will be possible.

Thereafter, when the wafers W have been housed in the etching drum 3, as shown in FIG. 9, the movable housing 17 is turned anti-clockwise by an angle of $\theta 1$, as seen in FIG. 10, whereby the set bar 20 supported by the movable housing 17 comes to a position it is assuming in FIG. 10 (this angle is not so large as to cause the set bar 20 to interfere with the wafer fork 8 nor is it so small as to allow the wafers W to fall from the drum 3 when the wafer fork 8 goes down); during this turning of the housing 17, the wafer fork 8 keeps supporting the wafers W. Incidentally, this turning of the housing 17 (set bar 20) is effected as the gear 23 is driven to turn by means of the drive gear 24 of the etching machine 10.

Figure 11:
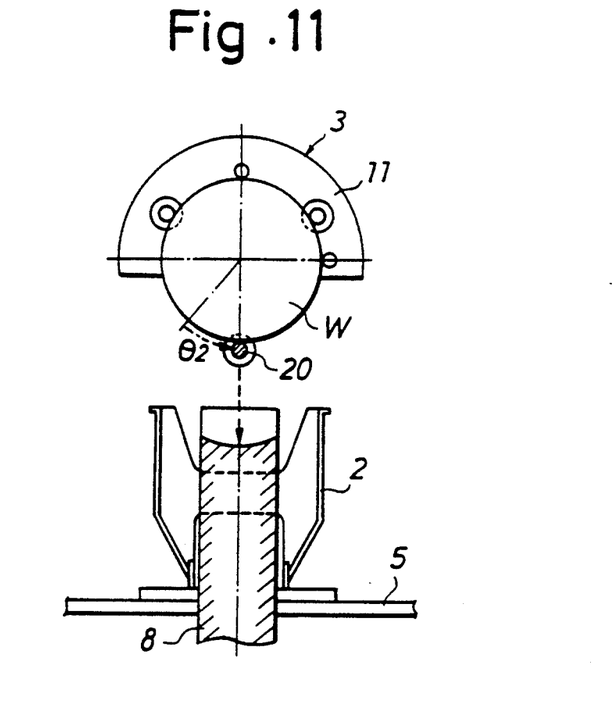
FIG. 11 is a schematic drawing showing one step of wafer trasfer operation.

Then, the air cylinder 6 (ref. FIG. 1) is operated again in a manner such that the wafer fork 8 is caused to descend until the wafer fork 8 is entirely removed from the etching drum 3, as shown in FIG. 11, and since the wafers W are now supported by the set bar 20, they do not drop out from the etching drum 3. When the wafer fork 8 has receded from the etching drum 3, the set bar 20 is then turned further by an angle of $\theta 2$ whereby the set bar 20 comes to a predetermined position (exactly below the centers of the wafers W), as shown in FIG. 11, and the etching drum 3 is closed.

Figure 12:
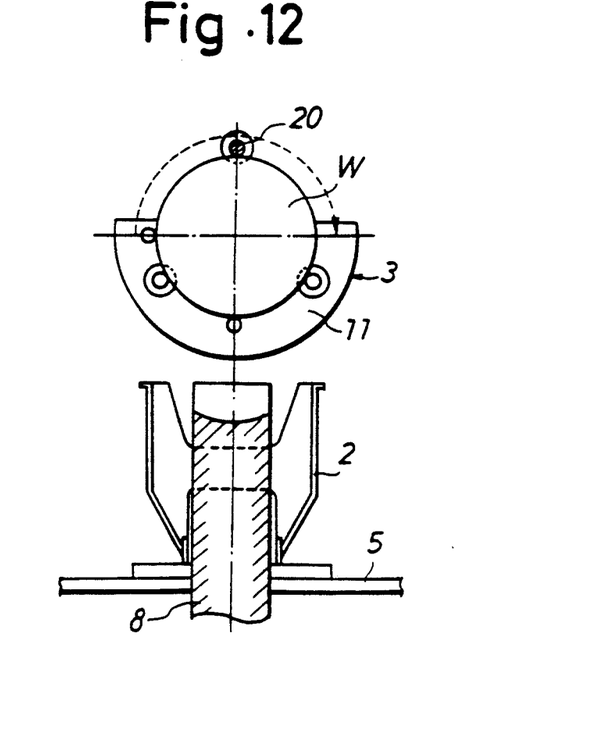
FIG. 12 is a schematic drawing showing one step of wafer trasfer operation.

In the end, as shown in FIG. 12, the etching drum 3 is turned clockwise through an angle of 180° by turning the gear 15 by means of the drive gear 16 of the etching machine 10, shown in FIG. 2, whereupon the operation of transferring the wafers W from the basket 2 to the etching drum 3 is completed, and the wafers W are now safely housed in the etching drum 3, as the main rollers 12, 12, the set bar 20, and the supplementary rollers 13, 13 contact the peripheral edges of the wafers W to thereby support them.

The etching drum 3 housing the wafers W in it is now steeped in the etchant held in an etching tank, not shown, by means of the etching machine 10. Then, as the gear 27 (FIG. 2) of the etching machine 10 is driven to turn, the gear 26 is turned and this rotation is transmitted to all of the other gears 26 by way of the center gear 25 so that all gears 26 rotate simultaneously at the same rate and in the same direction, and the main rollers 12, 12, the set bar 20, and the supplementary rollers 13, 13 are caused to turn and the wafers W supported by these turn round within the drum 3 and thus the etching of the wafer surface is facilitated, and the surface irregularities and the lapping abrasive powder rubbed into the wafer surface, which are caused during the surface lapping are removed.

As described above, this embodiment of the invention enables automatic transfer of the wafers W from the basket 2 to the drum 3, so that the entire wafer production line becomes more automatized and can be conducted in an in-line manner.

Obviously many modifications and variations of the present invention are possible in the light of the above teachings. It is therefore to be understood that within the scope of the appended claims the invention may be practiced otherwise than is specifically described.

What is claimed is:

1. An etching drum of an etching machine for etching wafers having a main housing consisting of a pair of vertical side plates facing parallel to each other and supported by an etching machine in a manner such that the main housing is capable of freely turning around about a central horizontal axis, at least two rollers supported, freely rotatable, by and between the side plates of the main housing in a manner such that the horizontal center lines of the rollers define a hypothetical circular cylinder whose diameter is slightly greater than that of the wafers so that the peripheral edges of the wafers rest on the rollers, and whose center line is identical with said central horizontal axis, the surface of these rollers being formed with a plurality of annularly cut grooves sized to receive the edges of the wafers and support the wafers vertically at suitable intervals in a horizontal row, and a drive mechanism for driving the rollers to rotate;

said etching drum being characterized by that there are further provided a movable housing consisting of a pair of side plates which face parallel to each other and are freely rotatory about said central horizontal axis independently from said main housing, a horizontal set bar supported between the side plates of the movable housing, the surface of the set bar being formed with numerous annularly cut grooves similar to those of said rollers, and the position of the set bar being such that its center line is a generating line of said hypothetical circular cylinder defined by the center lines of said rollers, and a drive mechanism for driving the movable housing to rotate about the central axis.

2. The etching drum as claimed in claim 1 wherein said set bar is also freely rotatory about its center line, being driven by means of said drive mechanism for the rollers.

3. The etching drum as claimed in claim 1, wherein said drive mechanism for the rollers comprises: small-diameter gears locked at those ends of said rollers which extend beyond one of the main housing's side plates; a small-diameter gear locked about that end of said set bar which is on the same side as the gear-bearing ends of the rollers; and a large-diameter gear which is rotary about said central axis and meshes with all of said small-diameter gears.

4. An automatic wafer transfer apparatus for automatically transferring a plurality of wafers housed in a wafer basket to a wafer etching drum which can assume an open posture whereby it can receive wafers, and a closed posture whereby wafers cannot escape from the etching drum, the etching drum comprising a main housing consisting of a pair of vertical side plates facing parallel to each other and supported by an etching machine in a manner such that the main housing is capable of freely turning around about a central horizontal axis, at least two rollers supported, freely rotatable, by and between the side plates of the main housing in a manner such that the horizontal center lines of the rollers define a hypothetical circular cylinder whose diameter is slightly greater than that of the wafers so that the peripheral edges of the wafers rest on the rollers, and whose center line is identical with said central horizontal axis, the surface of these rollers being formed with a plurality of annularly cut grooves sized to receive the edges of the wafers and support the wafers vertically at suitable intervals in a horizontal row, and a drive mechanism for driving the rollers to rotate;

a movable housing consisting of a pair of side plates which face parallel to each other and are freely rotatable about a central horizontal axis independently from a main housing, a horizontal set bar supported between the side plates of the movable housing, the surface of the set bar being formed with a plurality of annularly cut grooves similar to those of said rollers, and the position of the set bar being such that its center line is a generating line of the hypothetical circular cylinder defined said horizontal center lines of the rollers, and a drive mechanism for driving the movable housing to rotate about the central horizontal axis;

said wafer transfer apparatus comprising:

a transport means for transporting a basket containing the wafers to a location below said etching drum, an elevator means for elevating and lowering wafers, adapted to reciprocate vertically such that its top surface can pass through said etching drum, and a means for opening and closing said etching drum, which means comprises said movable housing and said horizontal set bar of the etching drum.

5. The automatic wafer transfer apparatus as claimed in claim 4 wherein said elevator means includes a wafer fork which is vertically shiftable by means of an air cylinder, and a wafer pusher provided on top of the wafer fork and having a top surface whose profile of a vertical cross-section is caved in in a suitable manner to receive wafers thereon.

6. The automatic wafer transfer apparatus as claimed in claim 5 wherein the cross-section of the concavity of the pusher top surface is of V-letter shape.

7. The automatic wafer transfer apparatus as claimed in claim 5 wherein the cross-section of the concavity of the pusher top surface is circular having the same curvature as the wafers.

8. The automatic wafer transfer apparatus as claimed in claim 6, wherein the wafer pusher has a vertical guide groove on each side and the inner wall of each side plate of the housing is formed with a vertical guide protrusion, said guide groove and said guide protrusion being slidably engageable so that the vertical movement of the wafer pusher is properly guided.

9. A method for automatically transferring a plurality of wafers at a time, from a wafer basket to an etching drum which can assume an open posture whereby it can receive wafers and a closed posture whereby wafers cannot escape from the etching drum, comprising the steps of:

transporting the wafer basket containing the wafers to a location below said etching drum, causing the etching drum to open downwardly, elevating the wafers from the wafer basket into the etching drum by means of an elevator means, causing the etching drum to close sufficiently to prevent the wafers from dropping, while supporting the wafers, and removing the elevator means from the etching drum, and completely closing the etching drum.

* * * * *